United States Patent [19]

Shichijo et al.

[11] 4,184,447
[45] Jan. 22, 1980

[54] TUNING APPARATUS

[75] Inventors: Hajime Shichijo, Fujisawa; Masamitsu Tsukatani, Tokyo; Toshihiko Kaji, Yokosuka, all of Japan

[73] Assignee: Sony Corporation, Tokyo, Japan

[21] Appl. No.: 974,235

[22] Filed: Dec. 29, 1978

[30] Foreign Application Priority Data

Dec. 29, 1977 [JP] Japan .............................. 52-176778[U]
Jan. 31, 1978 [JP] Japan .............................. 53-10717[U]

[51] Int. Cl.² ........................................... G12B 11/04
[52] U.S. Cl. ..................................... 116/262; 74/10.7; 74/89.22; 116/242; 116/261; 325/455; 334/86
[58] Field of Search .............. 116/241, 261, 262, 242, 116/282; 334/86; 74/10.7, 89.22, 89.2, 89; 325/455

[56] References Cited

U.S. PATENT DOCUMENTS

| | | | |
|---|---|---|---|
| 3,416,486 | 12/1968 | Mongesku | 116/262 |
| 3,431,884 | 3/1969 | Marantz | 116/262 |
| 3,962,641 | 6/1976 | Suwa | 334/86 |
| 4,041,890 | 8/1977 | Wilder | 116/282 |

Primary Examiner—S. Clement Swisher
Assistant Examiner—Denis E. Corr
Attorney, Agent, or Firm—Lewis H. Eslinger; Alvin Sinderbrand

[57] ABSTRACT

Tuning apparatus including a scale provided with indicia corresponding to different broadcast frequencies to which the tuning apparatus is tunable and a pointer movable across the scale to indicate the particular broadcast frequency to which the tuning apparatus is tuned. The pointer is supported by a movable support which is guided by a guide shaft. A plurality of markers are slidably guided along at least one guide rail and are individually settable to desired locations adjacent the scale, thereby representing particular broadcast frequencies to which the tuning apparatus is tunable. A key removably mounted on the guide shaft is bi-directionally driven therealong by the movable support, the key being selectively operative to engage a desired one of the markers to move the engaged marker along the guide rail as the support is moved, whereby the marker is set to a desired position by reason of its engagement with the key.

13 Claims, 14 Drawing Figures

TUNING APPARATUS

BACKGROUND OF THE INVENTION

This invention relates to tuning apparatus and, more particularly, to tuning apparatus which is tunable to desired ones of broadcast frequencies, such as FM and AM broadcast frequencies.

In many geographic locations, and particularly, larger metropolitan areas, a large number of FM and AM radio stations are provided. Thus, a user who has a home entertainment tuning device may receive a multitude of FM and AM broadcast frequencies. Often, the user may prefer to listen to the program entertainment which is transmitted over a relatively small number of such available broadcast frequencies. If a particular program received over one of these broadcast frequencies is not satisfactory, the user may adjust his tuning device so as to receive the program which is transmitted over another preferred broadcast frequency. However, many receivable broadcast frequencies may exist in the frequency band between the two stations to which the user tunes his tuning device. As the tuning condition of this device is changed, the programs which are transmitted via those intermediary broadcast frequencies will be received. Since the tuning condition of the tuning device is changed abruptly during this station-changing operation, the brief reception of undesired broadcast frequency information may be quite annoying and distracting to the user.

In order to rapidly change the tuning condition of a radio receiver from one station to another without accompanying undesired program information which is present in those broadcast frequencies which lie between the two stations, push-button radio tuning apparatus has been proposed. Such push-button tuning devices are used advantageously in automotive radio receivers. However, such push-button tuning devices generally are not provided in high fidelity home entertainment tuning apparatus. It is desirable to provide, in such home entertainment tuning apparatus, presettable means whereby the tuning apparatus can be rapidly and accurately tuned to preset FM and/or AM radio stations. It also is desirable to provide, in such tuning apparatus, the ability to change the preset FM and/or AM stations in accordance with the particular preferences of the user.

OBJECTS OF THE INVENTION

Therefore, it is an object of the present invention to provide improved tuning apparatus.

A further object of this invention is to provide tuning apparatus wherein certain FM and/or AM stations can be preset, as desired, and the tuning apparatus can be tuned rapidly to any one of these preset stations.

An additional object of this invention is to provide improved tuning apparatus of the aforedescribed type wherein the preset FM and/or AM stations can be changed easily in accordance with the particular preferences of the user.

Yet another object of this invention is to provide improved tuning apparatus of the aforedescribed type which is advantageously used in home entertainment radio receiving systems.

Various other objects, advantages and features of the present invention will become readily apparent from the ensuing detailed description, and the novel features will be particularly pointed out in the appended claims.

SUMMARY OF THE INVENTION

In accordance with this invention, tuning apparatus is provided with a scale having indicia thereon corresponding to different broadcast frequencies to which the tuning apparatus is tunable, and a pointer movable across the scale to indicate the particular broadcast frequencies to which the tuning apparatus is tuned. A movable support assembly supports the pointer and is slidably driven along a guide shaft. A plurality of markers are slidably supported on at least one guide rail, each marker being individually settable to a desired position adjacent the scale so as to represent a particular broadcast frequency to which the tuning apparatus is tunable. A key removably mounted on the guide shaft is bi-directionally driven therealong by the support assembly, the key being selectively operative to engage a desired one of the markers and move the engaged marker along the guide rail as the support assembly is driven, whereby the marker is set to a desired position by reason of its engagement with the key.

BRIEF DESCRIPTION OF THE DRAWINGS

The following detailed description, given by way of example, will best be understood in conjunction with the accompanying drawings in which.

DETAILED DESCRIPTION OF A PREFERRED EMBODIMENT

Figure 1:
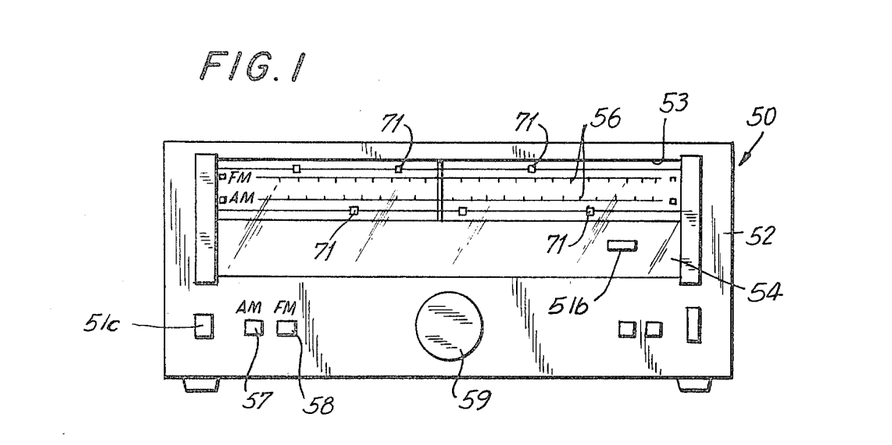
FIG. 1 is a front view of one embodiment of tuning apparatus which is provided with the present invention.
Figure 2:
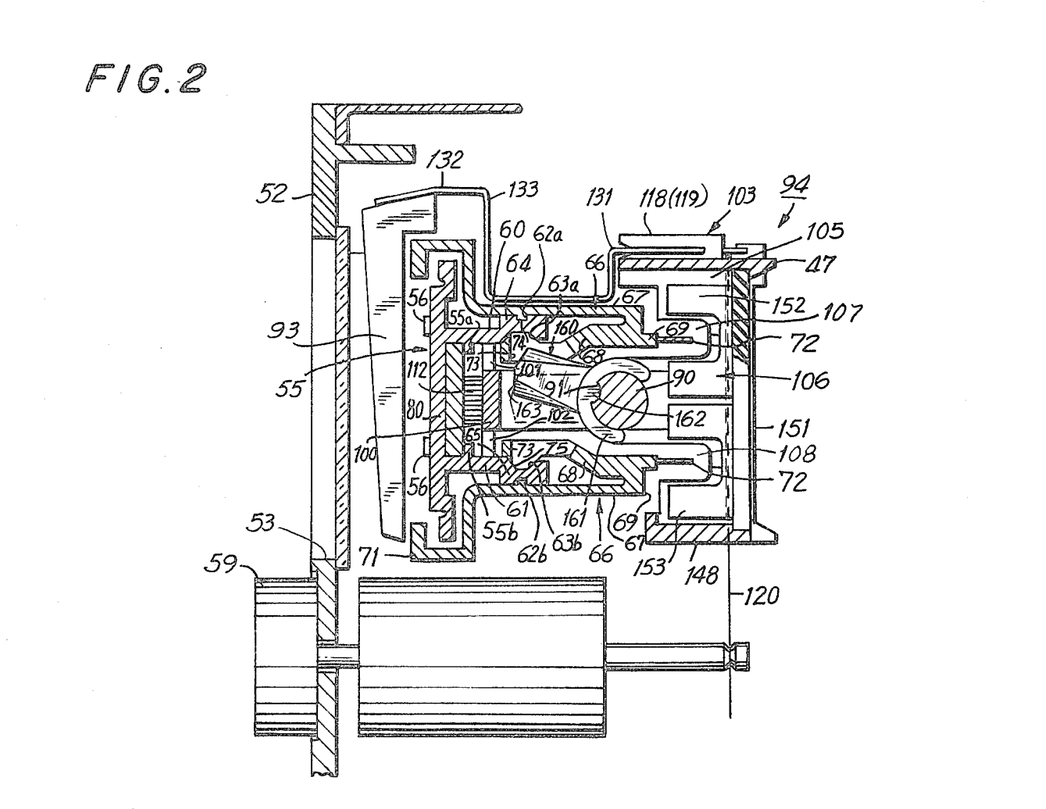
FIG. 2 is a partial sectional view of the mechanical arrangmenet of the tuning apparatus of this invention.
Figure 3:
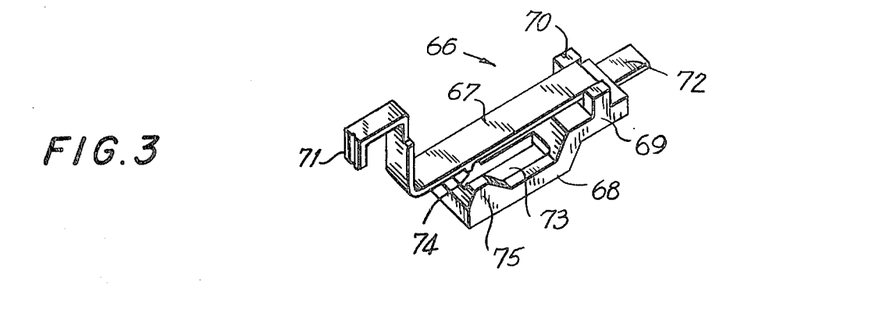
FIG. 3 is a perspective view of a settable marker in accordance with this invention.
Figure 4:
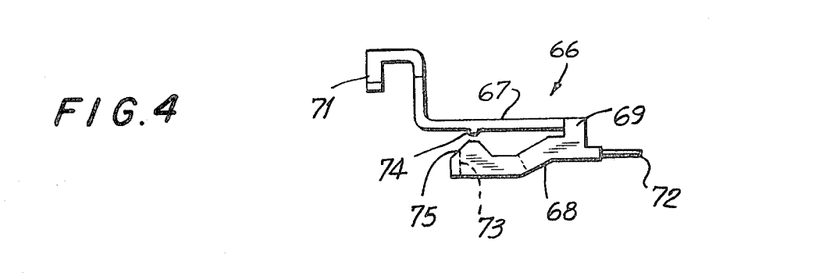
FIGS. 4 and 5 are side and bottom views, respectively, of the marker.
Figure 5:
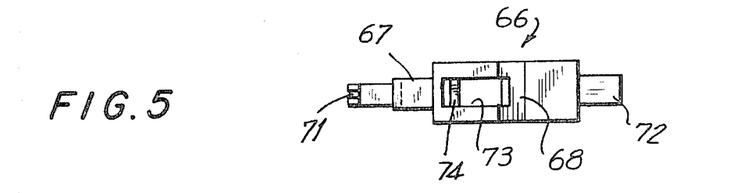

Referring now to the drawings, wherein like reference numerals are used throughout, and in particular to FIG. 1, there is illustrated a front view of tuning apparatus which incorporates the various features disclosed herein. For the purpose of the present discussion, it will be assumed that tuning apparatus 50 is adapted to be tuned to broadcast frequencies included in the FM band as well as to broadcast frequencies included in the FM band. However, if desired, the teachings of the present invention can be incorporated in tuning apparatus which is tunable to broadcast frequencies which are included only in the FM band or only in the AM band. Tuning apparatus 50 is provided with a front panel 52 in which are disposed various switches and indicators which commonly are used to control the tuning and receiving conditions of, for example, high fidelity tuning devices. Front panel 52 is provided with a window 53 for receiving a transparent plate 54. Disposed behind this transparent plate, and as shown more particularly in FIG. 2, is a scale plate 55 bearing indicia 56 which represent the particular broadcast frequencies, or stations, to which the tuning apparatus is tunable. Operating switches 57 and 58 are provided in front panel 52, these operating switches being operable by a user of tuning apparatus 50 to preset either an AM broadcast frequency or an FM broadcast frequency to which the tuning apparatus is to be tuned. An FM/AM selector switch 51c is provided for the selection of a desired frequency band. The signal information contained in the selected broadcast frequency to which tuning apparatus 50 is tuned will be recovered. The tuning apparatus also is provided with a tuning knob 59 which is coupled to a shaft journaled for rotation in front panel 52 and operable to control the tuning condition of tuning apparatus 50. As tuning knob 59 is rotated, a pointer 93 is driven across scale plate 55 so as to represent the particular station, as identified by indicia 56, to which the tuning apparatus is tuned.

In accordance with one feature of the present invention, a plurality of indicators 71 are provided, these indicators being disposed in two sets, one set being associated with the FM frequency band and the other set being associated with the AM frequency band. As will be described in greater detail below, indicators 71 are slidable relative to scale plate 55 and can be set to any desired position therealong. When an indicator 71 is juxtaposed a particular indicium 56, thus representing the corresponding station to which tuning apparatus 50 can be tuned, the user may rapidly tune the tuning apparatus to that station merely by rotating tuning knob 59 until pointer 93 is aligned with that indicator 71. The position of indicator 71 along scale plate 55 can be adjusted, as desired by the user, so as to change the particular preset station to which the tuning apparatus can be tuned.

Figure 6:
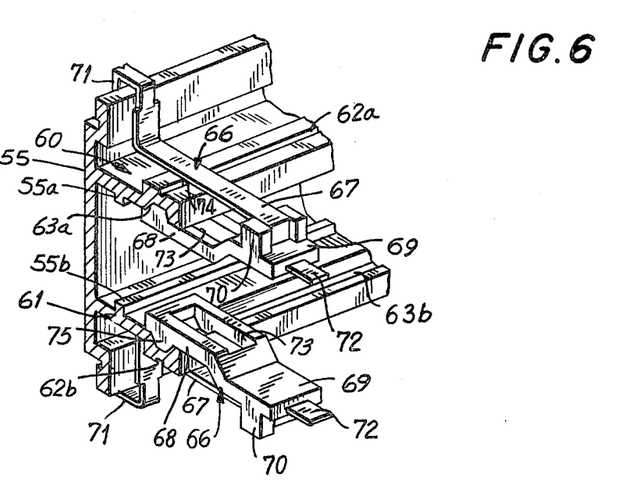
FIG. 6 is a perspective view of the manner in which the markers are guidably supported on guide rails.
Figure 7:
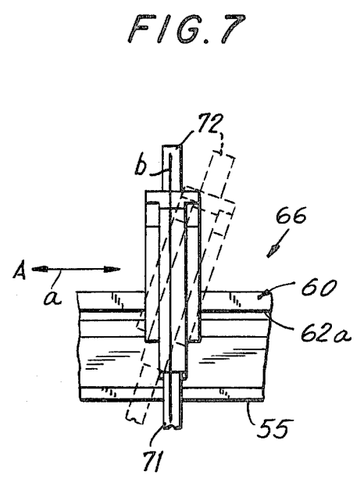
FIGS. 7 and 8 represent the stability of the markers which are used with the present invention.
Figure 8:
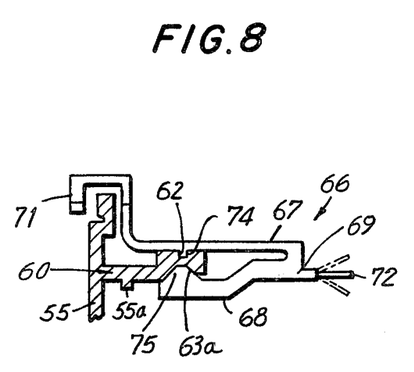
Figure 9:
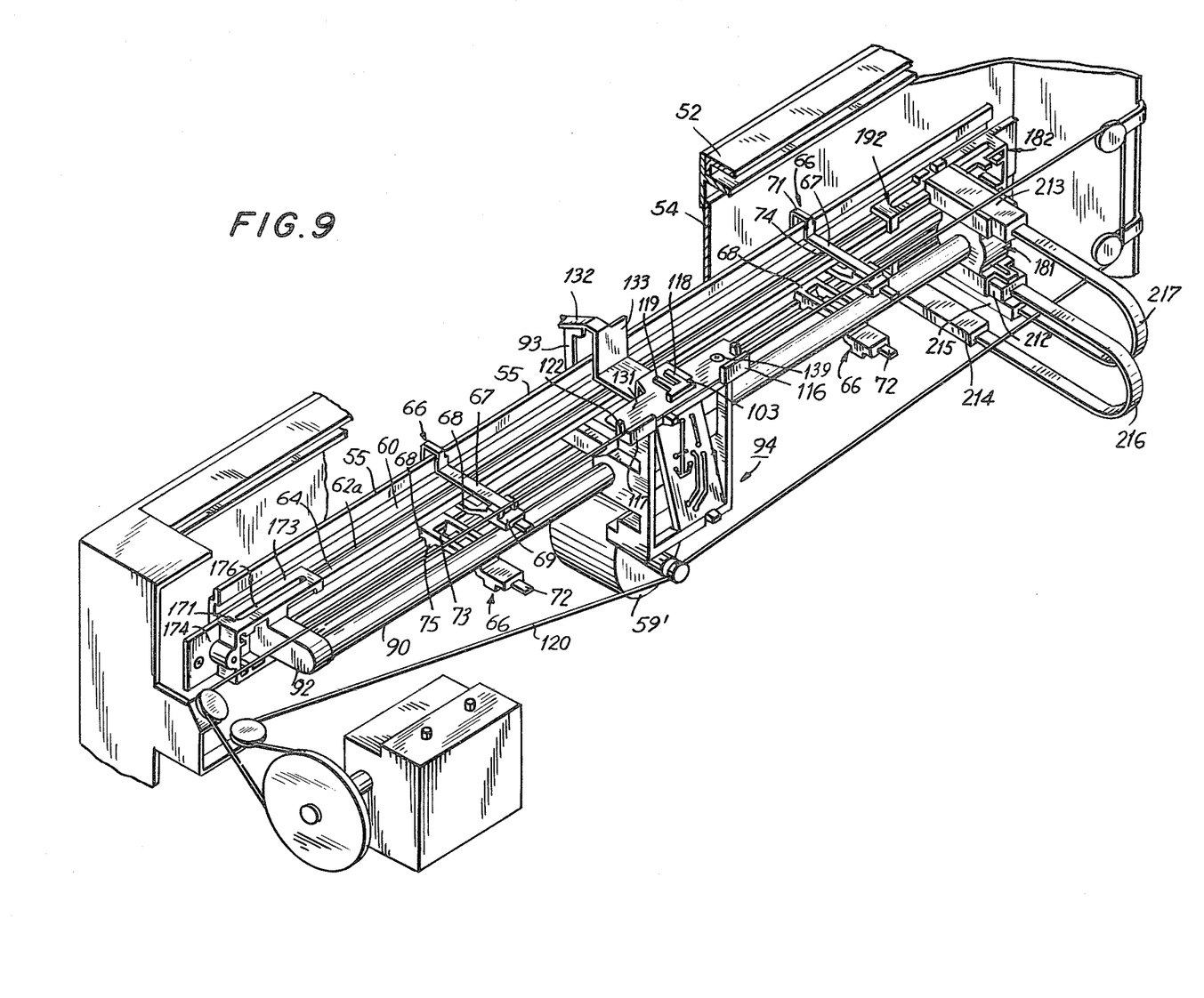
FIG. 9 is a perspective view of various sub-assemblies of the tuning apparatus in accordance with the present invention.

FIGS. 2, 6 and 9 illustrate, in greater detail, the subassembly which includes indicator 71 and the manner in which the respective indicators are supported and moved relative to scale plate 55. In particular, scale plate 55 is provided with an upper guide rail 60 and a lower guide rail 61, both guide rails extending in a longitudinal direction and being disposed in respective planes which are perpendicular to scale plate 55. The guide rails project from the rear surface of the scale plate, as best shown in FIG. 2. For the purpose of the present discussion, it is assumed that the "front" direction is toward front panel 52 and the "rear" direction is opposite thereto. Thus, indicia 56 are disposed on the front surface of scale plate 55, while upper and lower guide rails 60 and 61 both project from the rear surface of the scale plate. Upper guide rail 60 is provided with a longitudinal U-shaped groove 62a provided on the upper surface of rail extension 64, and with a longitudinal V-shaped groove 63a provided on the lower surface of rail extension 64. Lower guide rail 61 also is provided with a rail extension, designated as rail extension 65, and this rail extension is provided with a U-shaped groove 62b on the lower surface thereof and a V-shaped groove 63b on the upper surface thereof. Thus, upper and lower guide rails 60 and 61 are seen to be mirror images of each other, and the respective grooves provided on rail extensions 64 and 65 likewise are mirror image versions, or inverted versions, of each other.

The respective rail extensions are furnished with the U-shaped and V-shaped grooves to provide a suitable support for markers 66 to which indicators 71 are attached. As shown in FIGS. 2-8, each marker is provided with an upper leg 67 and a lower leg 68 which are joined at a juncture 69. Legs 67 and 68 are formed of a resilient material, such as a synthetic resin, and are biased naturally toward each other. Since these legs are resilient, they may be spread apart to be mounted upon rail extensions 64 and 65. A bridge 70 is supported on lower leg 68 to establish a pivot axis for upper leg 67. A rib 74 is provided on the lower surface of leg 67 approximately mid-way of the length thereof. This rib fits into U-shaped groove 62a (or 62b) and is slidable therein. Lower leg 68 is provided with a rib 75 in the vicinity of the free end thereof. As is seen from FIGS. 2-3, 4, 6 and 8, rib 75 is substantially V-shaped and is adapted to fit into V-shaped groove 63a (or 63b) of rail extension 64 (or 65). When rib 74 is inserted into U-shaped groove 62a and when rib 75 is inserted into V-shaped groove 63a, marker 66 is slidable along the length of upper guide rail 60, and particularly, along the length of rail extension 64. In a similar manner, a marker 66 is mounted upon rail extension 65 of lower guide rail 61 so as to be slidable along the length of the guide rail.

Indicator 71 is seen to be a substantially U-shaped member which extends from the free end of leg 67. With reference to an upper marker 66, indicator 71 is an inverted U-shaped member. As best seen in FIG. 2, this U-shape of indicator 71 is bent around the upper edge of scale plate 55 so that the free end of the indicator is visible through window 53. As marker 66 slides along guide rail 60, the relative position of the marker is perceived by the juxtaposition of indicator 71 with respect to indicia 56, as best shown in FIG. 2. Similarly, the U-shape of indicator 71 provided on a lower marker 66 is not inverted; and as shown in FIG. 2, this U-shape is bent about the lower edge of scale plate 55. As the lower marker slides along guide rail 61, the position thereof is ascertained by perceiving the juxtaposition of indicator 71 relative to indicia 56.

In each marker 66, leg 68 is provided with an aperture 73, as best seen in FIGS. 2, 3, 5 and 6. Thus, in an upper marker 66, aperture 73 faces toward lower guide rail 61; and, conversely, in a lower marker 66, aperture 73 faces toward upper guide rail 60. Each aperture is adapted to receive a key 160, selectively insertable therein, so that marker 66 is slidably driven along upper guide rail 60 or along lower guide rail 61 is the key is driven. This is described in greater detail hereinbelow. It will be appreciated that this slidable driving movement of marker 66 establishes the marker at a desired position along the guide rail, and thus at a desired position along scale plate 55 relative to indicia 56.

Each marker 66 is provided with a projection 72, used as a light shutter plate, described in greater detail in copending application (Ser. No. 974,229), extending rearwardly from juncture 59, as shown in FIGS. 2-8. The purpose of projection 72 is to intercept, or block light in a light switch housed in the sub-assembly which also is used to support pointer 93, when pointer 93 is moved to an aligned position with indicator 71 of the respective marker.

The manner in which a marker 66 is secured to a rail extension of either the upper or lower guide rail is readily apparent. That is, legs 67 and 68 are displaced from each other so that ribs 74 and 75 can be aligned with respect to the U-shaped and V-shaped grooves.

Because of the resilience of the material with which marker 66 is constructed, when legs 67 and 68 no longer are forced apart, they return toward each other such that the ribs fit within the respective grooves in the rail extension. Preferably, leg 68 is wider than leg 67 such that the marker is supported with high stability. Rib 75 may, in fact, be formed of a pair of ribs disposed on opposite sides of aperture 73, as best seen in FIG. 6. Furthermore, because of the resilience of the material from which marker 66 is constructed, and since ribs 74 and 75 are of complementary shapes with respect to U-shaped and V-shaped grooves 62a and 63, respectively, once the marker is fitted onto a guide rail, it is held in a stabilized position so as to resist misalignment thereof which may be caused by vibration. Hence, even if marker 66 is twisted, as repesented by the broken lines in FIG. 7, it will return to its proper, normal position. In this position, the marker extends in a longitudinal direction normal to the rear surface of scale plate 55, whereby projection 72 will be in proper alignment with the light switch when pointer 93 is aligned with indicator 71.

It is appreciated that ribs 74, 75 and grooves 62, 63 constitute mounting elements which are complementary to each other. That is, the ribs provided on marker 66 are complementary to the grooves provided on rail extensions 64 (65). If desired, the rail extension may be provided with ribs and the marker may be provided with complementary grooves. As a further alternative, the marker may be provided with a single rib and the rail extension may be provided with a single groove. This, however, would require that the marker be constructed of material which is of a higher resiliency. Thus, it may be seen that the purpose of these mounting elements on the marker and on the rail extension is to maintain the marker in a normal, stabilized position, and to enable the marker to be slid along the rail extension to a desired location only when the marker is positively driven. Because of the resiliency of the material with which the marker is constructed, the marker grips the rail extension so that is will not be displaced relative to indicia 56 on scale plate 55 due to vibration, shock and the like. The preset positions of the respective markers thus are maintained.

The manner in which pointer 93 is assembled and driven, and the sub-assembly for the aforementioned wiper element and key now will be described with reference to FIGS. 2 and 10. A guide shaft 90 is provided rearwardly of scale plate 55, this guide shaft extending lengthwise, as shown more clearly in FIG. 9, between a socket 92, disposed at one end thereof for supporting the guide shaft, and a rotatable support 181, provided at the other end thereof for supporting and driving the guide shaft.

A support assembly 94 is slidably mounted on guide shaft 90, the support assembly serving to support ponter 93 and a wiper element 112, the latter being used to pick up coded indicia identifying the broadcast frequency which is indicated by the pointer, for use in the frequency synthesizer of the tuning apparatus, as disclosed in greater detail in copending application (Ser. No. 974,229). Support assembly 94 is comprised of a base 95 which, in side view, appears as an E-shaped structure. A bifurcated bracket 96, which appears as the middle leg of the E-shape, is formed of a left leg 96a and a right leg 96b, as viewed in FIG. 10. Each leg is provided with a respective channel 97a and 97b, respectively, through which guide shaft 90 passes. Each leg 97a, 97b includes a top web and a bottom web, the top and bottom webs of a leg being connected by a side wall and by a front wall. Right and left legs 98 and 99, respectively, are secured to the front walls which join the top and bottom webs of legs 96b and 96a, respectively. Legs 98 and 99 are of similar construction, and as can be seen from FIG. 10, leg 98 is comprised of top and bottom struts 98a and 98b, respectively. Legs 98 and 99 extend in the forward direction from base 95 and are joined by a cross-piece 100.

Figure 10:
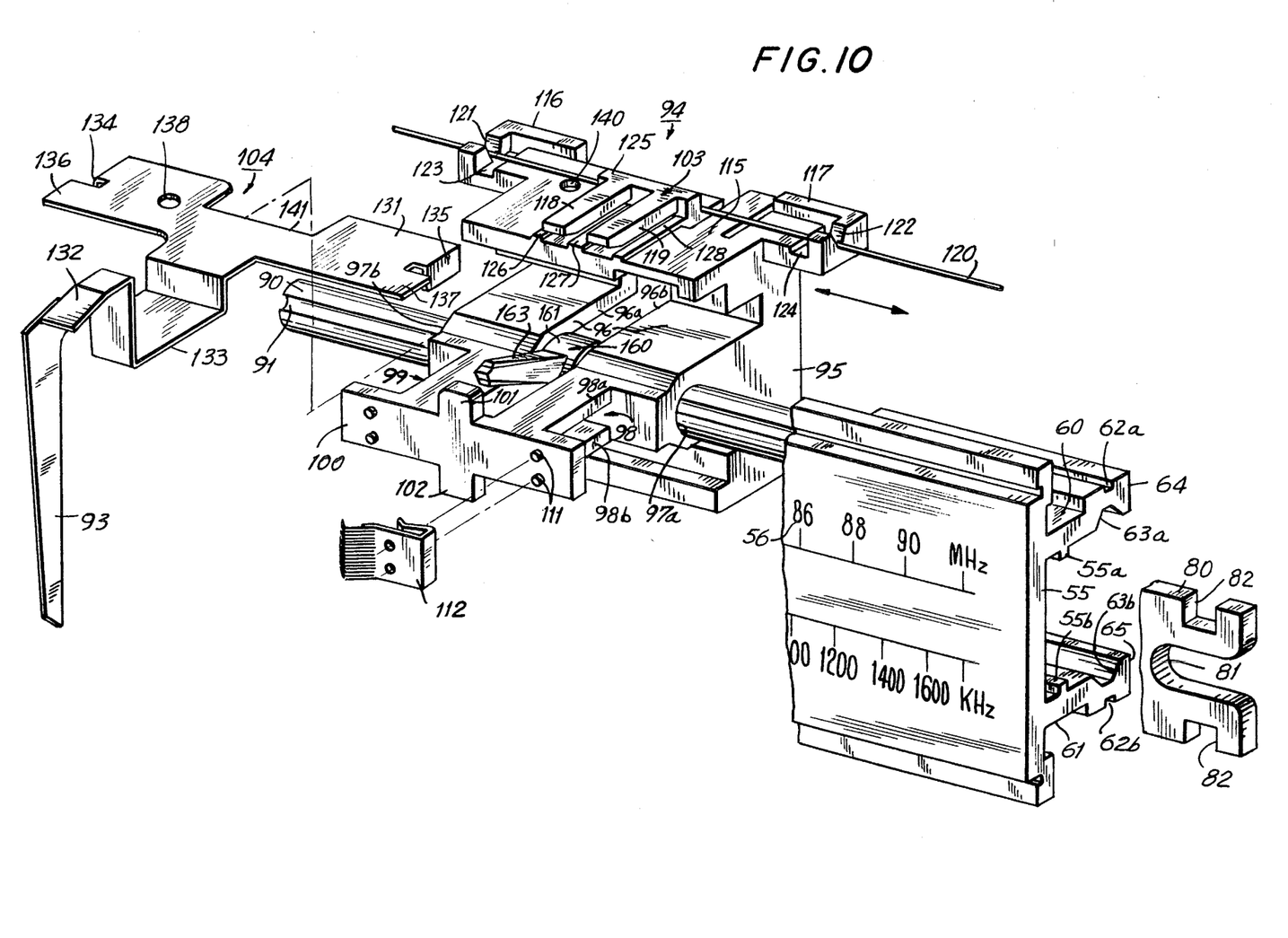
FIG. 10 is a perspective view of the pointer, key and support assembly used in the tuning apparatus of this invention.

Projections 101 and 102 extend upwardly and downwardly, respectively, from cross-piece 100, as shown in FIG. 10. These projections functions as stabilizing members and are adapted to ride along upper and lower guide rails 60 and 61, respectively, as shown in FIG. 2. In particular, projections 101 and 102 are positioned between ribs 55a, 55b and rail extensions 64, 65, as shown. On the front surface of cross-piece 100, that is, the surface of the cross-piece which faces a code plate 80 (FIG. 2), are provided bosses 111 to which wiper element 112 is attached. The cooperation between cross-piece 100, wiper element 112 and code plate 80 is shown in FIG. 2. Hence, as support assembly 94 is slidably driven along guide shaft 90, wiper element 112 scans code plate 80, to produce a digital signal which is related to the position of support assembly 94. This digital signal identifies the particular station which is indicated by pointer 93.

Figure 12:
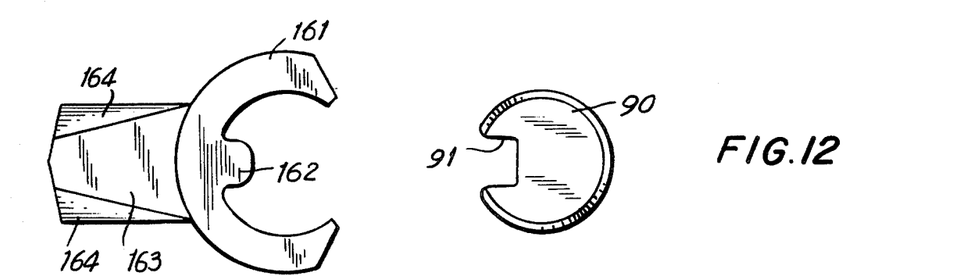

Pointer 93 is included in a pointer assembly 104, this assembly being secured to support assembly 94 by a pointer mounting clip 103. In addition to having the pointer assembly mounted thereon, base 95 forms a housing 105 for a light switch 106 (FIG. 2) Housing 105 is provided with a central opening 146 which extends from the top to the bottom of this housing, and also separates legs 96a and 96b of bifurcated bracket 96, as shown in FIG. 12. Gaps 107 and 108 are provided between the middle leg and the top and bottom legs, respectively, of the E-shaped housing. As shown in FIG. 2, projections 72 of markers 66 are adapted to be received in gaps 107 and 108 as support assembly 94 is slidably driven along guide shaft 90.

Base 95 has an upper portion 115 which serves as a table upon which pointer mounting clip 103 is supported. An L-shaped ridge 116 is provided on the rear and left side edge of upper portion 115, and a similar L-shaped ridge 117 is provided on the rear and right side edge of upper portion 115, as viewed in FIG. 10. Pointer mounting clip 103 includes arms 118 and 119 which are joined at one end of each by a crosspiece 125. Thus, arms 118 and 119 extend forwardly of crosspiece 125, and the free ends of these arms are chamfered. Arms 118 and 119 cooperate with ribs 126, 127 and 128, provided on upper portion 115 of base 95 so as to define a slot therebetween for receiving a plate 131 to which pointer 93 is secured.

As best seen from FIG. 9, a cable 120 is provided to drive support assembly 94 as a function of the rotation of tuning knob 59. The tuning knob 59 is coupled to cable 120 by suitable means, and this cable extends about various guide pulleys and also is secured to support assembly 94. As shown in FIG. 10, L-shaped ridges 116 and 117 are provided with notches 121 and 122, these notches being illustrated as substantially V-shaped. Notches 121 and 122 receive cable 120 which extends across upper portion 115 behind cross-piece 125 of pointer mounting clip 103. In addition, upper portion 115 is provided with grooves 123 and 124 which are adjacent ridges 116 and 117, respectively these grooves extending in a direction that is substantially perpendicular to cable 120. It is seen that upper portion 115 of base 95 is provided with a pair of wings on which the L-shaped ridges, notches and grooves are provided.

Pointer assembly 104 is comprised of plate 131 having a forwardly extending portion 132 which is coupled to the plate by a gooseneck extension 133. Pointer 93 is secured to forwardly extending portion 132. At the left and right sides of plate 131 are provided depending ears 134 and 135. These ears are adapted to be inserted into grooves 123 and 124, respectively, so as to secure cable 120 therein. The left and right sides of plate 131 also are provided with extensions 136 and 137 which facilitate the assembly and disassembly of pointer assembly 104 on support assembly 94. Plate 131 also is provided with an aperture 138 which is aligned with hole 140 is upper portion 115 of base 95 so that a screw 139 secures plate 131 upon this upper portion. In addition, plate 131 includes a cut-out 141 for accommodating pointer mounting clip 103 when the plate is mounted upon upper portion 115.

In assembling pointer assembly 104 to base 95, plate 131 is inserted into the slot defined by legs 118 and 119 of pointer mounting clip 103 and ribs 126–128. The plate then is pushed in the rearward direction so that cut-out 141 is positioned within the pointer mounting clip. Extensions 136 and 137 are raised, for example, by an operator lifting these extensions, so that ears 134 and 135 are disposed over grooves 123 and 124, respectively, as plate 131 is continued to be pushed in the rearward direction. When plate 131 abuts against ridges 116 and 117, extensions 136 and 137 are lowered so that ears 134 and 135 are inserted into grooves 123 and 124. Before plate 131 reaches its final position on upper portion 115 of base 95, cable 120 extends from notch 121 to notch 122, and thus passes over grooves 123 and 124. With extensions 136 and 137 raised, ears 134 and 135 can be positioned over grooves 123 and 124 with cable 120 interposed between each ear and its respective groove. Then, when extensions 136 and 137 are lowered, ears 134 and 135 force cable 120 deeply into grooves 123 and 124 so as to secure the cable to base 95. In this regard, it may be desirable that cable 120 can be compressed when ears 134 and 135 and inserted into grooves 123 and 124. In this manner, cable 120 is clamped to support assembly 94 such that when this cable is driven, such as in the direction indicated by the arrow in FIG. 10, the support assembly is correspondingly driven along guide shaft 90 in the same direction.

When pointer assembly 104 is mounted upon support assembly 94, pointer 93 is aligned with wiper element 112. Thus, as support assembly 94 is moved along guide shaft 90, pointer 93 scans indicia 56 provided on scale plate 50 so as to indicate the particular braodcast frequency to which the tuning apparatus in tuned. A multibit digital signal representing this indicated broadcast frequency is produced by wiper element 112 as the wiper element scans code plate 80.

It is recognized that base 95 is provided with apertures 97a and 97b for receiving guide shaft 90. Projections 101 and 102 cooperate with upper and lower guide rails 60 and 71 to prevent any rotation of base 95 about the guide shaft. Thus, and as mentioned hereinabove, projections 101 and 102 serve to stabilize support assembly 94 as this support assembly is supported upon and slidably driven along guide shaft 90.

In order to facilitate the insertion of plate 131 into pointer mounting clip 103 and to assemble pointer assembly 104 onto base 95, plate 131 and gooseneck extension 133 preferably are of a resilient material, such as a spring metal, a synthetic resin, or the like. It is appreciated that, in order to remove pointer assembly 104 from base 95, the reverse of the aformentioned assembly steps are followed.

Figure 11:
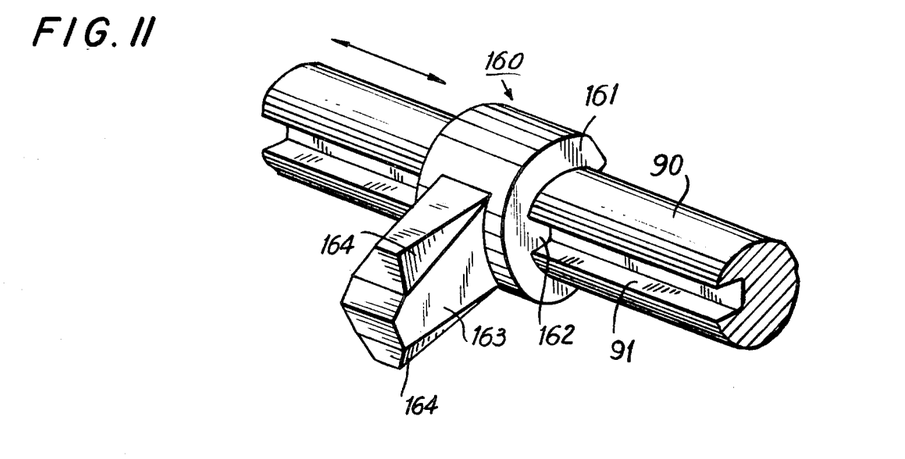
FIGS. 11-14 represent the key and the manner in which the key is mounted on the guide shaft in the tuning apparatus of the present invention.

As mentioned briefly hereinabove, key 160 is provided to be selectively inserted into aperture 73 of a marker 66 so as to engage the marker and thereby position same to a desired location along upper or lower guide rails 60 and 61, relative to indicia 56 on scale palte 55. Key 160, which is shown in FIG. 2, is shown in greater detail in FIGS. 10–14. This key is slidably mounted on guide shaft 90 and is disposed between legs 96a and 96b of bifurcated bracket 96. Key 160 includes an arcuate gripping member 161 whose free end portions are separated by an angle of about 100°. Gripping member 161 is made of a resilient material, such as a synthetic resin, and includes a nub 162 projecting in a radially inward direction. As shown in FIG. 11, nub 162 is adapted to be inserted into longitudinal groove 91 of guide shaft 90.

The key additionally includes an engaging member 163 secured to gripping member 161. Engaging member 163 is a bar extending in a radially outward direction from the gripping member, this engaging member being positioned between legs 98 and 99 of support assembly 94, as shown in FIG. 10. Engaging member 163 is provided with chamfered edges 164 so as to taper the engaging member in the upper and lower portions thereof. In addition, the front end, or nose, of the engaging member also is chamfered upward and downward from a diametrically central location, as shown in FIGS. 11–14. By sloping the side and front edges of engaging member 163, the engaging member can be inserted easily into aperture 73 of a marker 66.

Figure 13:
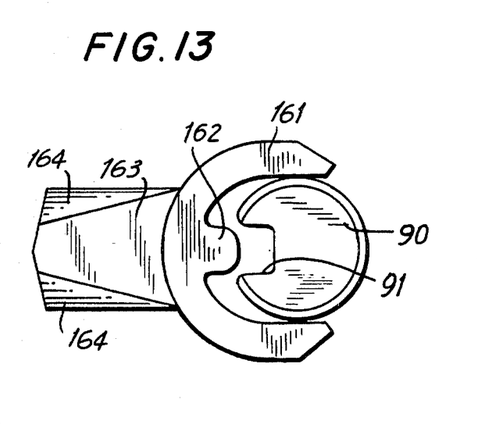
Figure 14:
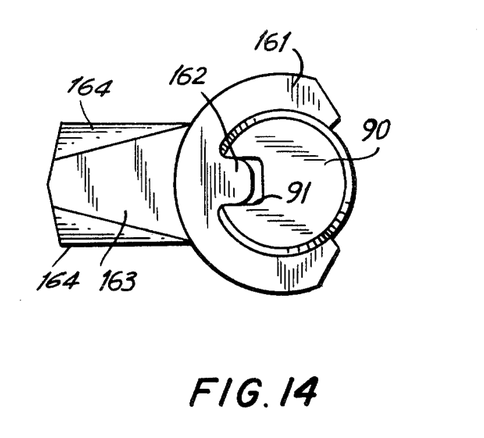

In securing key 160 to guide shaft 90, support assembly 94 first is mounted on the guide shaft. Then, and as shown in FIGS. 12 and 13, the key is brought into position relative to the guide shaft. The free ends of arcuate gripping member 161 are displaced from each other so as to fit about guide shaft 90, as shown in FIG. 13. Then, key 160 is pushed further onto the guide shaft such that nub 162 is inserted into groove 91. The free ends of gripping member 161 then will form about the guide shaft so as to grippingly engage the shaft and thereby secure key 160 thereon.

Since the key is disposed between legs 98 and 99 of support assembly 94, it is appreciated that, as the support assembly moves along guide shaft 90, key 160 is pushed thereby such that the key also slides along the guide shaft. As shown in FIGS. 2 and 9, the key is positioned between rail extensions 64 and 65 of upper and lower guide rails 60 and 61, respectively. When support assembly 94 is positioned such that pointer 93 is in alignment with indicator 71 of a marker 66, guide shaft 90 is rotated, as explained in copending application (Ser. No. 974,234), so as to correspondingly rotate key 160. If the guide shaft is rotated in the clockwise direction, engaging member 163 is inserted into aperture 73 of a marker 66 which is mounted on the upper guide rail. That is, the engaging member is inserted into the aperture of a marker associated with the FM frequency band. Conversely, if guide shaft 90 is rotated in the counterclockwise direction, key 160 likewise is rotated in this same direction such that engaging member 163 is inserted into aperture 73 of a marker 66 associated with the AM frequency band. Then, if guide shaft 90 is maintained in this rotated direction, that is, if key 160 is maintained in engagement with a marker 66, subsequent movement of support assembly 94 will push key 160 so as to slide the engaged marker in the direction in which the support assembly is moved. Hence, marker 66 may be displaced to any other desired location, that is, to any desired, preset station, represented by indicia 56 on scale plate 55.

It may now be appreciated that engaging member 163 would be mis-aligned with aperture 73 of a marker 66 if the marker is not stably mounted on the guide rail. That is, if the marker is twisted, as represented by the broken lines shown in FIG. 7, then, even though pointer 93 may be aligned with indicator 71, engaging member 163, which also is aligned with pointer 93, would not be in alignment with aperture 73. Thus, when guide shaft 90 is rotated, engaging member 163 would not be inserted into the aperture and, therefore, key 160 would not engage marker 66.

As shown in FIG. 9, one end of guide shaft 90 is supported in socket 92 and is rotatable therein. The other end of this guide shaft is supported in a rotatable support 181 which, in turn, is supported on the chassis of the tuning apparatus by a support structure 182. The socket 92 is mounted on a support bracket 171 which includes a pair of legs (only leg 173 being shown) which are joined, at one end thereof, by a cross member 174. The cross member is a relatively flat plate which includes a hole for the purpose of affixing support bracket 171 to an appropriate member (such as the front panel or the chassis) of the tuning apparatus. Each leg of the support bracket is provided with a slit (such as slit 176) to add resiliency to the legs, whereby support bracket 171 can be mounted over guide rails 60 and 61 of scale plate 55.

As mentioned above, and as illustrated in FIG. 9, the other end of guide shaft 90, that is, the end of the guide shaft which is remote from the end supported in socket 92, is supported in rotatable support 181 which, in turn, is provided in support structure 182. The purpose of rotatable support 181 is to receive an end of guide shaft 90 and, moreover, to be turned either in the clockwise or counterclockwise direction so as to impart a corresponding rotation to the guide shaft supported thereby. This turning movement of rotatable support 181 is controlled from a remote location and, particularly, is controlled by the user of the tuning apparatus in response to his depression of operating switches 57 and 58 (FIG. 1). Support structure 182 is similar to aforedescribed support bracket 171 in that the support structure is formed of a pair of legs which grip rail extension 64 of upper guide rail 60, and rail extension 65 on lower guide rail 61. Thus, support structure 182 is mounted upon scale plate 55 at an end of the scale plate remote from the end upon which support bracket 171 is mounted.

Rotatable support 181 is rotatably driven in the counterclockwise and clockwise directions in response to the manual operation of operating switches 57 and 58, shown in FIG. 1. These operating switches are, for example, releasable push-button switches which, when depressed, operate to move respective fingers disposed in housings 213 and 212, respectively, for rotatably driving support 181, as described in greater detail in copending application (Ser. No. 974,234). To this effect, transmission straps 216 and 217 are connected between housings 212, 213 and operating switches 58, 57 respectively, via a securing block 214 which is mechanically coupled to operating switch 58 to receive transmission strap 216; and, similarly, via a securing block 215 which is coupled to operating switch 57 to receive transmission strap 217. A spring release mechanism also may be provided, whereby when the depressed operating switch is released, the transmission strap returns to its normal, quiescent position, thereby also returning the finger connected thereto to its normal, quiescent position.

The manner in which operating switches 57 and 58 are used now will be briefly described. Let it be assumed that a marker 66 associated with, for example, the AM frequency band, is to be moved from one station-identifying location to another. Tuning knob 59 is operated so as to drive cable 120, thereby moving support assembly 94 along guide shaft 90. When pointer 93 is aligned with indicator 71 of the appropriate marker, tuning knob 50 no longer is operated. Instead, operating switch 57 is depressed, thereby rotating rotatable support 181 to rotate drive shaft 90, whereby key 160, which is secured to guide shaft 90, also is rotated. Consequently, engaging member 163 of key 160 is inserted into aperture 73 of the marker with which the key is aligned, that is, the marker whose indicator 71 is juxtaposed pointer 93.

Once marker 66 is engaged by key 160 in the foregoing manner, tuning knob 59 may be rotated so that support assembly 94 again is driven along guide shaft 90, either toward the right or toward the left, as desired by the user. As support assembly 94 is driven, key 160 is pushed by the support assembly, whereby marker 66 slides along lower guide rail 61 to any additional desired position.

When support assembly 94 reaches a preferred position along scale plate 55, as indicated by the particular indicium 56 aligned with pointer 93, and thus with indicator 71, the depressed operating switch 57 can be released. This, in turn, returns rotatable support 181, guide shaft 90 and key 160 to their normal positions. Consequently, engaging member 163 is withdrawn from aperture 73, thereby disengaging key 160 from marker 66. The marker now remains at its present position, thus representing a desired broadcast frequency, or AM station, to which the illustrated tuning apparatus may be tuned. Of course, if it is desired to alter the position of this marker, the foregoing operation can be repeated, whereby operating switch 57 is depressed so as to engage key 160 with this marker and thereby enable the marker to be displaced when tuning knob 59 is rotated.

An operation similar to the aforedescribed is performed in the event that a marker 66 associated with the FM band is to be adjusted, or positioned, to a location along scale plate 55 corresponding to a desired FM broadcast frequency.

The tuning circuitry which can be used in tuning apparatus 50 is disclosed in greater detail in copending application (Ser. No. 974,229). Suffice it to say that, after markers 66 have been preset to desired locations, the output of the tuning circuitry is in one operation, muted while tuning knob 59 is rotated. When pointer 93 is aligned with a preset marker, the muting operation is terminated, and the program information received via the broadcast frequency to which the tuning apparatus then is tuned is recovered. Thus, tuning apparatus 50 can be rapidly and accurately tuned to any desired, preset broadcast frequency. If it is preferred to override the aforementioned muting operation when tuning knob 59 is rotated, this can be achieved by operating muting switch 51b (FIG. 1) to its "OFF" position.

Thus, it is seen that markers 66 provided on the upper and/or lower guide rails 60, 61 can be moved to any desired location relative to scale plate 55 merely by positioning key 160 in alignment with aperture 73 provided on leg 68, and then by operating one of operating switches 57 and 58 so as to rotate guide shaft 90 and thereby insert key 160 into this aperture. Then, if tuning knob 59 is rotated so as to drive support assembly 94 along guide shaft 90, key 160, which remains in engagement with the marker, will slidably displace the marker along its guide rail to any desired location. Release of operating switch 57 or 58 will return guide shaft 90 and key 160 to their respective quiescent positions. This disengages the key from aperture 73 in marker 66.

While the present invention has been particularly shown and described with reference to a preferred embodiment, various changes and modifications in form and details may be made without departing from the spirit and scope of the invention. Some of these changes and modifications have been discussed hereinabove. In addition to these, it is appreciated that, if desired, still other guide rails, similar to guide rails 60 and 61, may be provided, each additional guide rail being associated with a respective frequency band, such as a citizen's band, a short wave band, or the like. Markers, similar to aforedescribed markers 66, may be provided on these additional guide rails for positioning to any desired location so as to preset corresponding frequencies to which the tuning apparatus can be tuned. The manner in which these additional markers are positioned is similar to that described above.

It is, therefore, intended that the appended claims be interpreted as including these, as well as the foregoing and other such changes and modifications.

What is claimed is:

1. Tuning apparatus comprising a scale provided with indicia corresponding to different broadcast frequencies to which said tuning apparatus is tunable; pointer means movable across said scale to indicate the particular broadcast frequency to which said tuning apparatus is tuned; movable support means for supporting said pointer means and for moving said pointer means across said scale; a plurality of marking means, each being settable to a desired position along said scale to represent a particular broadcast frequency to which said tuning apparatus is tunable; first guide means for guiding said support means, said support means being slidable on said first guide means; second guide means for guiding said marking means, said marking means being slidable on said second guide means; and key means removably mounted on said first guide means and driven bi-directionally along said first guide means by the movement of said support means, said key means being selectively operative to engage one of said marking means to move the engaged marking means along said second guide means as said support means is moved along said first guide means, whereby said engaged marking means is set to a desired position along said scale.

2. The apparatus of claim 1 wherein said first guide means comprises a guide shaft; and wherein said key means comprises an arcuate gripping member formed of resilient material, the free ends of said gripping member being adapted to be spread to be placed upon said guide shaft, so as to engage and slidably grip said guide shaft; and an engaging member extending from said gripping member and being adapted to engage one of said marking means.

3. The apparatus of claim 2 wherein said guide shaft is provided with a longitudinal groove, and wherein said acruate gripping member is provided with a nub for mating with said groove and slidable therealong, said key means being in predetermined alignment with respect to said guide shaft by reason of said nub mating with said groove.

4. The apparatus of claim 3 wherein said marking means are guided by said second guide means in the vicinity of said key means, each marking means including an aperture for receiving said engaging member of said key means.

5. The apparatus of claim 4 further comprising selectively operable drive means for rotating said guide shaft, whereby said arcuate gripping member and engaging member rotate with said guide shaft to insert said engaging member into the aperture of a marking means if said marking means is in predetermined aligned relationship with said key means.

6. The apparatus of claim 5 wherein said support means comprises a base; and a bifurcated bracket extending from said base and having a pair of legs, each provided with a channel for receiving said guide shaft; and said gripping member is positioned between said legs of said bifurcated bracket.

7. The apparatus of claim 6 wherein said second guide means comprises a pair of parallel guide rails spaced apart from each other and extending in a direction parallel to said guide shaft, each of said guide rails providing a slidable support for respective ones of said marking means such that some of said marking means are supported above said engaging member and others of said marking means are supported below said engaging member, whereby rotation of said guide shaft in one direction causes said engaging member to be inserted into the aperture of a marking means supported above said engaging member and rotation of said guide shaft in an opposite direction causes said engaging member to be inserted into the aperture of a marking means supported below said engaging member.

8. The apparatus of claim 1 wherein said second guide means comprises at least one guide rail for slidably supporting respective ones of said marking means; and wherein each of said marking means includes mounting means formed of resilient material for engaging opposite surfaces of said at least one guide rail.

9. The apparatus of claim 8 wherein said mounting means comprises first and second mounting elements and wherein said at least one guide rail is provided with first and second complementary mounting elements at opposite surfaces thereof.

10. The apparatus of claim 9 wherein said first mounting element and said first complementary mounting element comprise a first pair, said second mounting element and said second complementary mounting element comprise a second pair, each pair being formed of a rib and a groove.

11. The apparatus of claim 10 wherein all of said mounting elements comprise ribs and all of said complementary mounting elements comprise grooves.

12. The apparatus of claim 8 wherein each of said marking means comprises a pair of legs joined at one end thereof, each of said legs including said mounting means to engage opposite surfaces of said at least one guide rail; one of said legs being provided with an aperture to receive said key means and the other of said legs being provided with an indicator portion juxtaposed to said scale to represent the particular broadcast frequency to which said marking means has been set.

13. The apparatus of claim 12 wherein said scale comprises a scale plate extending in a plane substantially parallel to said at least one guide rail and having said indicia thereon; and said indicator portion of each of said marking means extends about a longitudinal edge of said scale plate into juxtaposition with said indicia.

* * * * *